United States Patent [19]

Arakawa et al.

[11] Patent Number: 4,855,680
[45] Date of Patent: Aug. 8, 1989

[54] ENHANCED DECOUPLING OF MRI RF COIL PAIRS DURING RF TUNING OF MRI RF TRANSMIT COIL

[75] Inventors: Mitsuaki Arakawa, Hillsborough; Brenda G. Nichols, San Francisco, both of Calif.

[73] Assignee: The Regents of the University of California, Berkeley, Calif.

[21] Appl. No.: 115,723

[22] Filed: Nov. 2, 1987

[51] Int. Cl.[4] .......................................... G01R 33/20
[52] U.S. Cl. .................................... 324/314; 324/322
[58] Field of Search .............. 324/300, 307, 309, 318, 324/319, 322, 314; 128/653; 336/155, 200

[56] References Cited

U.S. PATENT DOCUMENTS

| 4,207,530 | 6/1980 | Gallagher | 336/155 |
| 4,620,155 | 10/1986 | Edelstein | 324/322 |
| 4,714,886 | 12/1987 | Halpern | 324/318 |

Primary Examiner—Michael J. Tokar
Attorney, Agent, or Firm—Nixon & Vanderhye

[57] ABSTRACT

Frequency tuning and coupling capacitances in MRI RF receive coils are typically realized, at least in part, as reverse biased varactor diodes. During RF tuning of the transmit coil (i.e., so as to achieve resonance and matched impedance conditions), at least some if not all of the varactors associated with the receive coil are forward biased so as to simultaneously maximize detuning of the receive coil to resonant frequencies removed as far as possible from that of the transmitter coil being tuned while also then substantially reducing the Q of the receive coil.

5 Claims, 6 Drawing Sheets

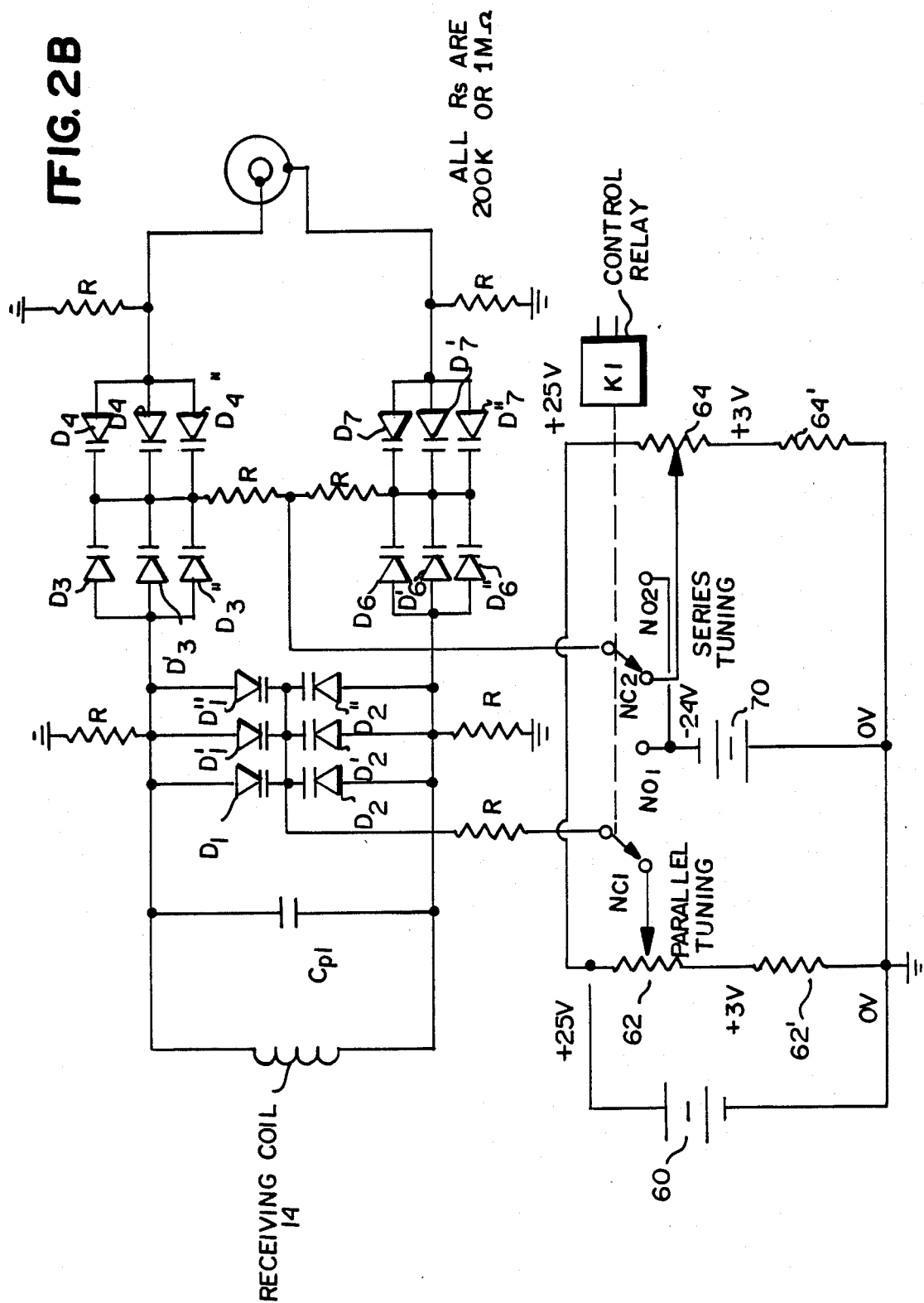

ENHANCED DECOUPLING OF MRI RF COIL PAIRS DURING RF TUNING OF MRI RF TRANSMIT COIL

This invention is generally directed to the art of magnetic resonance imaging (MRI) utilizing nuclear magnetic resonance (NMR) phenomena. It is more particularly directed to method and apparatus for enhancing proper detuning of an MRI RF receive coil during set-up tuning of a resonant MRI RF transmit coil.

In commercially available MRI systems, it is conventional practice to provide electrically controllable RF tuning/coupling capacitances associated with RF receive coils. Typically, such electrically controlled capacitances are realized as reverse biased varactor diodes. Such varactor diodes typically exhibit a capacitance versus voltage curve which provides for increasing capacitance as the reverse voltage across the diode is reduced in magnitude or, conversely, reduced capacitance as the reverse bias voltage across the diodes is increased in magnitude.

Since commercial MRI systems employ sophisticated computer control capabilities, it is quite understandable that they already provide for automatic computer-controlled tuning of these receiver coils by suitably controlling the reverse bias voltage across such varactor diodes. Since the resonant frequency and Q of the transmit/receive coils is affected by the individual properties of a patient's tissue which is coupled to such coils during MRI procedures, there is typically an initial "setup" procedure performed after the coils are in a place with respect to a particular patient's anatomy within the MRI magnet, etc. During this initial setup phase, preparatory to actual imaging sequences, an operator typically tunes the transmit coil variable capacitors for a desired resonance and for maximum coupling (i.e., a matched impedance condition with the RF transmission line and transmitter).

For various reasons well-known in the art, if a separate RF receive coil is being utilized, it is desirable to have that coil decoupled from the transmit coil during such stepup tuning procedures. For example, it has heretofore been customary for the reverse bias voltage supplied to receive coil varactors to be reduced to minimum magnitude (i.e., zero volts) during setup tuning of the transmit coil. By this technique, the effective capacitance of such varactor diodes is (hopefully) considerably increased thus, in effect, detuning and decoupling the receive coil from the transmit coil as the latter is being tuned.

However, if the tuned receiver coil already uses a reverse bias voltage near zero volts, when the detuning effect may not be achieved to the degree desirable. This possible lack of desired detuning effect would become even more pronounced if plural varactors are connected in parallel (i.e., to obtain greater tuning range) since lower tuned coil varactor voltage magnitudes may typically be expected.

Using such prior automatic detuning techniques, it has typically been possible to detune the receiver coil by a maximum of approximately 2 MHz (e.g., from a resonant frequency of about 15 MHz to a lower off-resonant frequency of about 13 MHz). While this has provided some significant decoupling of the receive coil during transmit coil tuning, additional decoupling is still desirable. And it would be advantageous to permit use of plural parallel-connected varactor diodes.

We have now discovered that such objects can be achieved by the simple expedient of applying a suitable forward bias voltage to the varactor diodes of the receive coil during transmit coil tuning precedures. In other words, the normal polarity of the varactor diode bias voltage (i.e., so as to reverse bias the diode) is reversed (i.e., so as to forward bias the diode) to achieve enhanced decoupling and detuning of the receive coil. It has also been discovered that the desirable decoupling and detuning effect increases with an increasing magnitude of forward bias voltage to the varactor diode.

It has also been discovered that use of parallel-connected varactor capacitances (so as to achieve greater total tunable capacitance) is now facilitated by such new detuning procedures.

These as well as other objects and advantages of this invention will be more completely appreciated by carefully studying the following detailed description of a presently preferred exemplary embodiment of this invention when taken in conjunction with the accompanying drawings, of which:

FIG. 2B is a detailed schematic diagram of a receive coil with parallel-connected varactor diodes and a switched polarity detuning bias source in accordance with a presently preferred exemplary embodiment of this invention;

Figure 1:
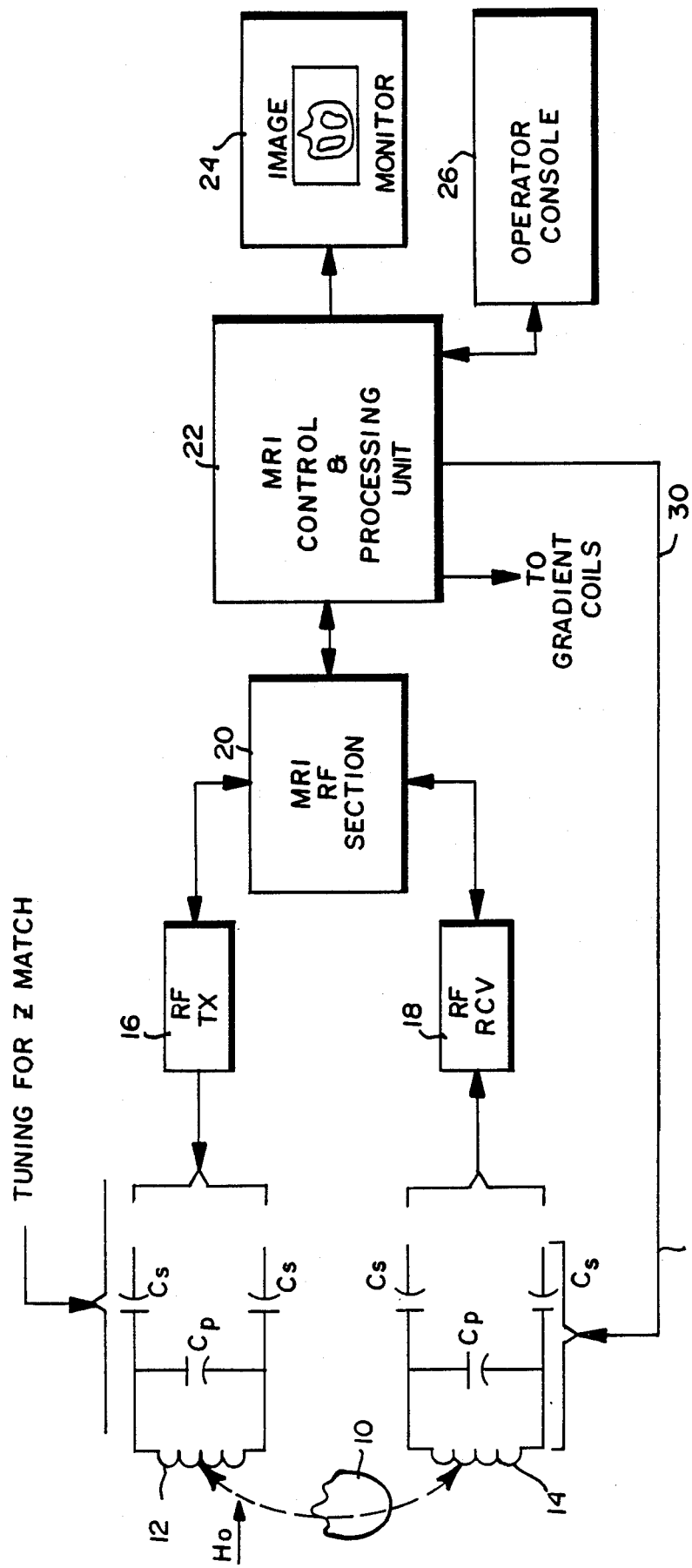
FIG. 1 is schematic diagram of an MRI system modified so as to practice this invention.

FIG. 1 schematically depicts some of the elements of a typical MRI system. For example, a patient 10 is typically coupled to a transmit coil 12 and to a receive coil 14. Both coils may be tuned to suitable resonant frequencies by associated parallel capacitances $C_p$ and suitably adjusted via series capacitance(s) $C_s$ to an RF transmitter 16 and RF receiver 18 associated with an MRI RF section 20 which is, in turn, typically controlled by an MRI control and processing unit 22. During MRI imaging sequences, the control unit 22 causes a programmed sequence of RF pulses to be transmitted via transmit coil 12 into the tissue of patient 10 while suitable gradients are produced in a static magnetic field $H_o$ via suitable magnetic gradient coils (not shown). NMR RF responses are received via receive coil 14 and processed so as to produce an image at monitor 24 (and/or to store image data, etc). The whole system is typically controlled from a suitable operator console 26.

As previously explained, commercially available MRI systems already typically realize the RF receiver coil series capacitances and/or parallel tuning capacitances (at least in part) as varactor diodes which are appropriately reverse biased. Such bias control is typically provided via line(s) 30 during automatic or manual tuning for impedance match and resonance during conventional MRI setup procedures. As previously explained, it is also conventional for the control unit 22 to simultaneously detune varactor diodes associated with the separate receive coil, if any (e.g., during the tuning of the transmit coil, via suitable changes in the varactor diode bias voltages supplied via line(s) 30. In the past, such detuning bias voltages on lines 30 have been in the form of reducing the reverse bias voltage magnitude to a minimum value (thus, hopefully, substantially increasing the capacitance and lowering the resonant frequency of the receive coil 14).

However, as depicted in FIG. 1, in accordance with this invention, the detuning control via line(s) 30 to the receive coil varactor diodes actually reverses polarity so as to forward bias such varactor diodes and thus to provide and enhance the degree of automatic detuning during transmit coil tuning procedures.

Since existing commercially available MRI systems typically already provide for automatic de-tuning of the receive coil while tuning the transmit coil (e.g., by concurrently automatically changing the bias voltage supplied to varactor diodes associated with the receive coil), it is not believed necessary to burden the present discussion with a detailed description of how such automatic controls are programmed within the control algorithm of the control unit 22. Rather, all that is necessary is that such existing control algorithms be slightly modified so as to reverse the polarity of the detuning bias voltage supplied via line(s) 30—and to control it to a suitable magnitude.

Figure 2A:
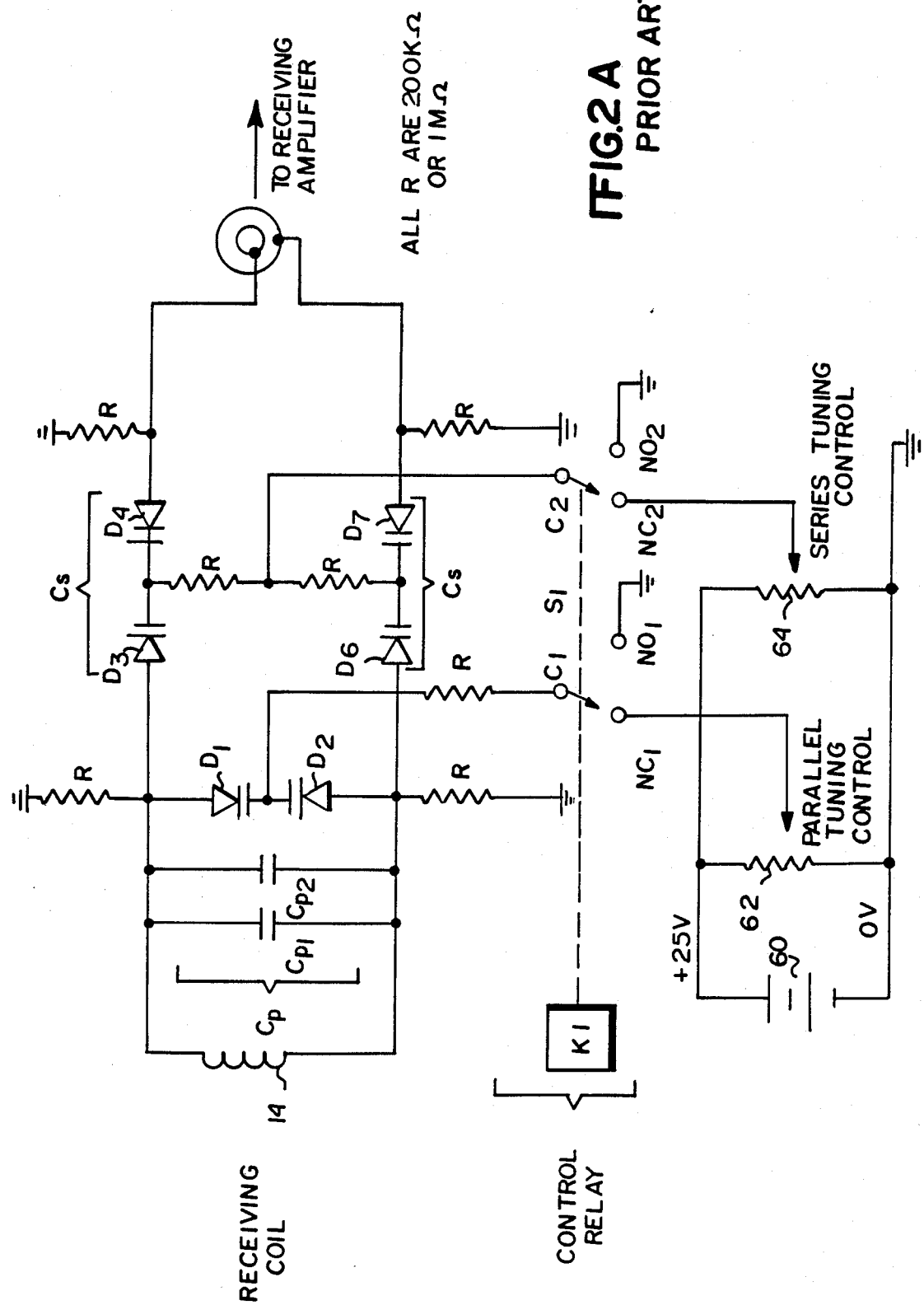
FIG. 2A is a detailed schematic diagram of the receive coil with a typical prior art arrangement of varactor diodes with computer controlled switched bias voltage source using grounded leads for detuning.

A typical prior art MRI RF receive coil circuit is depicted in FIG. 2A. The varactor diodes $D_1$ through $D_7$ are arranged to provide coupling/matching capacitances $C_s$ and at least part of the parallel tuning capacitance $C_p$. Resistances R isolate the dc varactor bias circuit from the RF circuit. Switch S1 normally connects the diodes $D_1$–$D_7$ with a source of reverse bias from battery 60 which is adjustable via potetiometers 62 and 64 to provide independent adjustment of $C_p$ and $C_s$ capacitances. Upon receiving a detune command from the control computer, relay K1 actuates switch S1 contacts so as to ground the bias control leads of the varactors $D_1$–$D_7$ thus reducing the reverse bias to a minimum zero value (or to some other relatively smaller magnitude of reverse bias voltage).

Although those in the art will no doubt appreciate that reverse polarity and magnitude control in accordance with this invention can be achieved in many different ways, one possible scheme is schematically depicted at FIG. 2B. As can be seen in FIG. 2B, varactor diodes $D_1$ through $D''_7$ are arranged to provide the coupling/matching capacitances $C_s$ and (at least part of the) parallel tuning capacitance $C_p$ associated with receive coil 14. Suitable DC bias control circuits are again isolated from RF via strategically positioned resistances R. Relay K1 and contacts of switch S1 normally connect the varactors with reverse bias voltage adjustable in magnitude via potentiometers 62 and 64 (with a minimum tuned bias of about 3 volts being defined by resistances 62' and 64'). Now, however, when a detune command from the control computer actuates relay coil K1, the contacts of switch S1 provide a forward bias of 24 volts across the varactors via battery 70.

In FIG. 2B, such forward bias voltage is supplied at a fixed level. However, as those in the art will appreciate, suitable additional controllable attenuators may be provided in association with the reverse polarity bias voltage so as to also provide a controllable magnitude of forward bias to the varactor diodes during receiver coil detuning times.

As can be seen in FIG. 2B, each varactor $D_1$–$D_7$ has an additional pair of similar varactors D', D'' connected in parallel therewith. This provides a greater range of tunable capacitance over a smaller range of bias voltage. It also permits use of a smaller fixed capacitance $C_{p1}$ in the parallel tuning capacitance.

Figure 3:
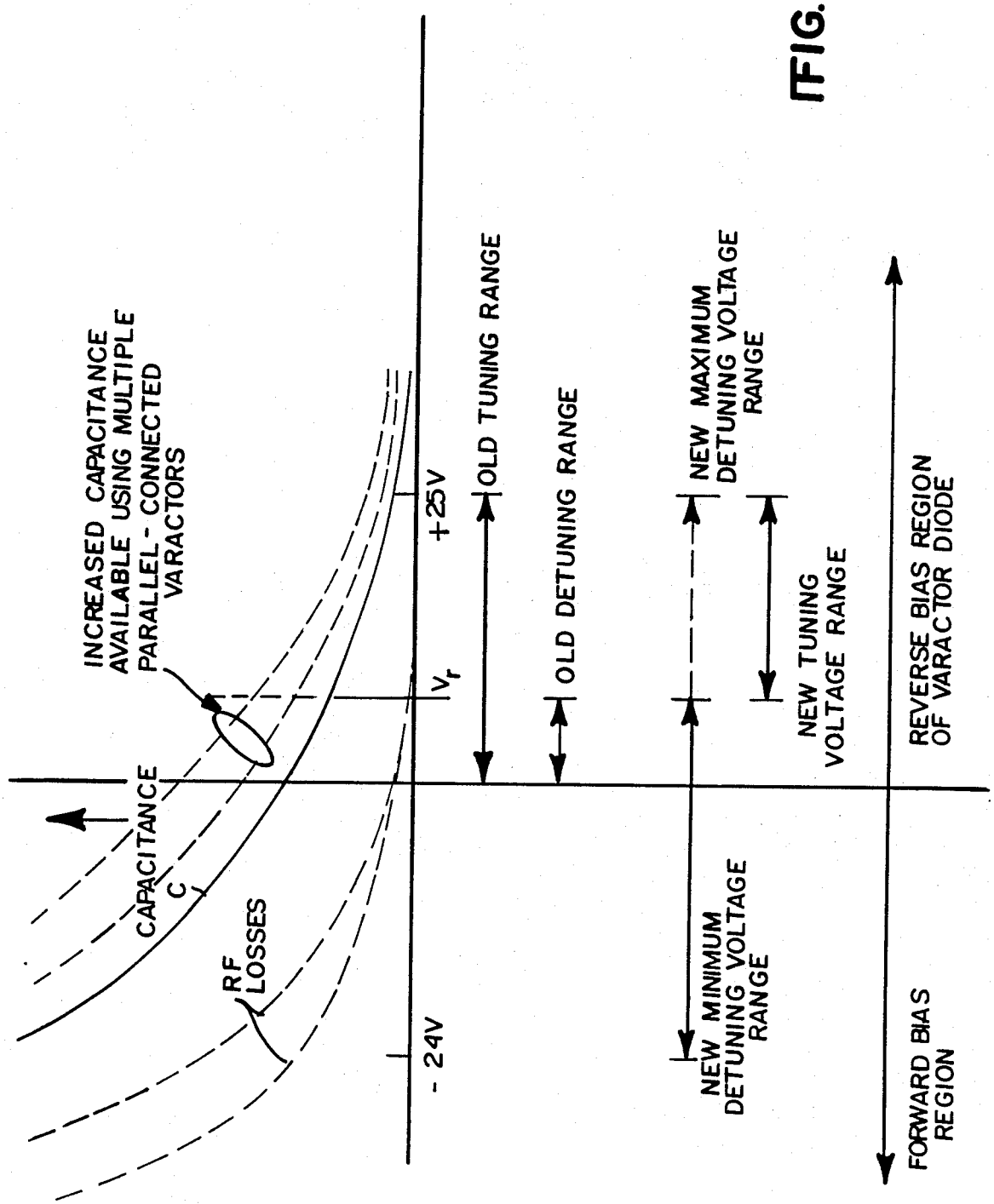
FIG. 3 is a schematic graphical depiction of the manner in which capacitance and associated RF losses in a typical varactor diode device vary as a function of applied bias voltage.

As depicted in FIG. 3, the capacitance of a varactor diode typically decreases as the magnitude of reverse bias is increased. Typical ranges of operating reverse bias for the varactor voltages (for both the old and new arrangements) are depicted in FIG. 3. As depicted in FIG. 3, is a typical prior art minimum detuning bias voltage (e.g., 0 volts) overlapped somewhat with the possible tuning range of bias voltages. Also depicted in FIG. 3 lines is a schematic depiction of typical RF losses that may be associated with varactor diodes. As shown, such RF losses remain at fairly low levels so long as the diode is reverse biased (as it is during normal conventional operation).

However, in accordance with this invention, it is now proposed that, during detuning times, the polarity of the varactor diode bias voltage be reversed (e.g., so as to forward bias the diodes) to significant values (e.g., $-5$ volts, $-10$ volts, $-40$ volts, etc). As may be generally observed from the schematic depiction of FIG. 3, the capacitance of the varactor continues to increase and, in addition, the RF losses associated with the capacitance will dramatically increase as the varactor diodes become forward biased to an ever greater extent.

Figure 4:
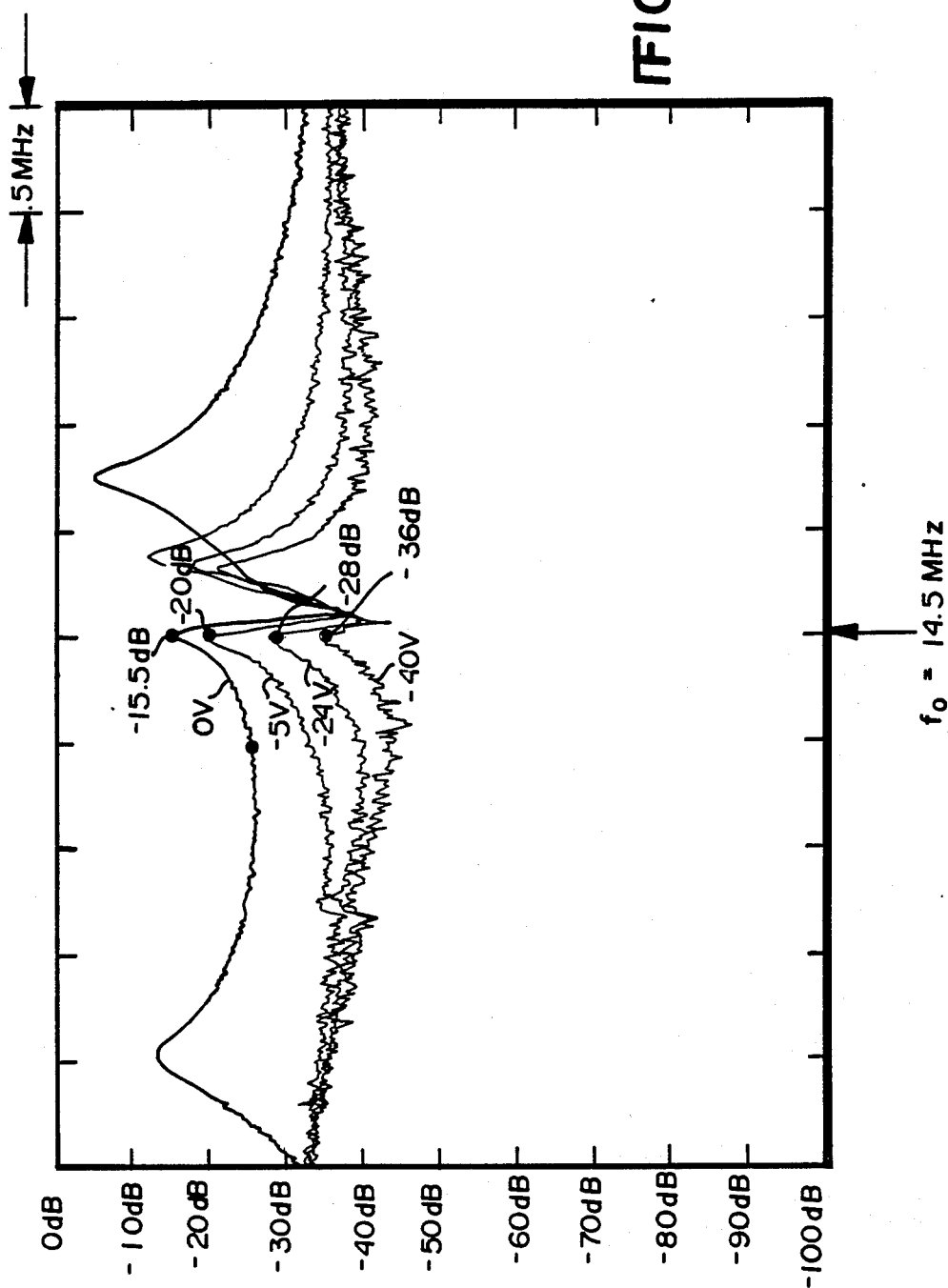
FIG. 4 depicts a graph of relative coupling between transmit/receive coil pairs for different varactor diode bias voltages.

A graphical depiction of coupling between the transmit and receive coils resulting from four different varactor diode bias voltages is depicted at FIG. 4. As can be seen, at a center frequency of 14.5 MHz (e.g., the center resonant frequency of the transmit coil), a zero varactor diode bias voltage produced approximately $-15$ dB of isolation between the coils. However, when the varactor diodes are forward biased (e.g., by a negative voltage with respect to ground in the circuit of FIG. 2), the magitude of decoupling increases. For example, at $-5$ volts, the coupling between coils decreases to $-20$ dB. At $-24$ volts, the coil coupling decreases even further to approximately $-28$ dB. And at a forward bias magnitude of 40 volts, the decoupling increases still further to approximately $-36$ dB. All of these degrees of decoupling are substantially greater (and therefore more desirable) than that which was attainable using prior conventional detuning techniques.

Figure 5:
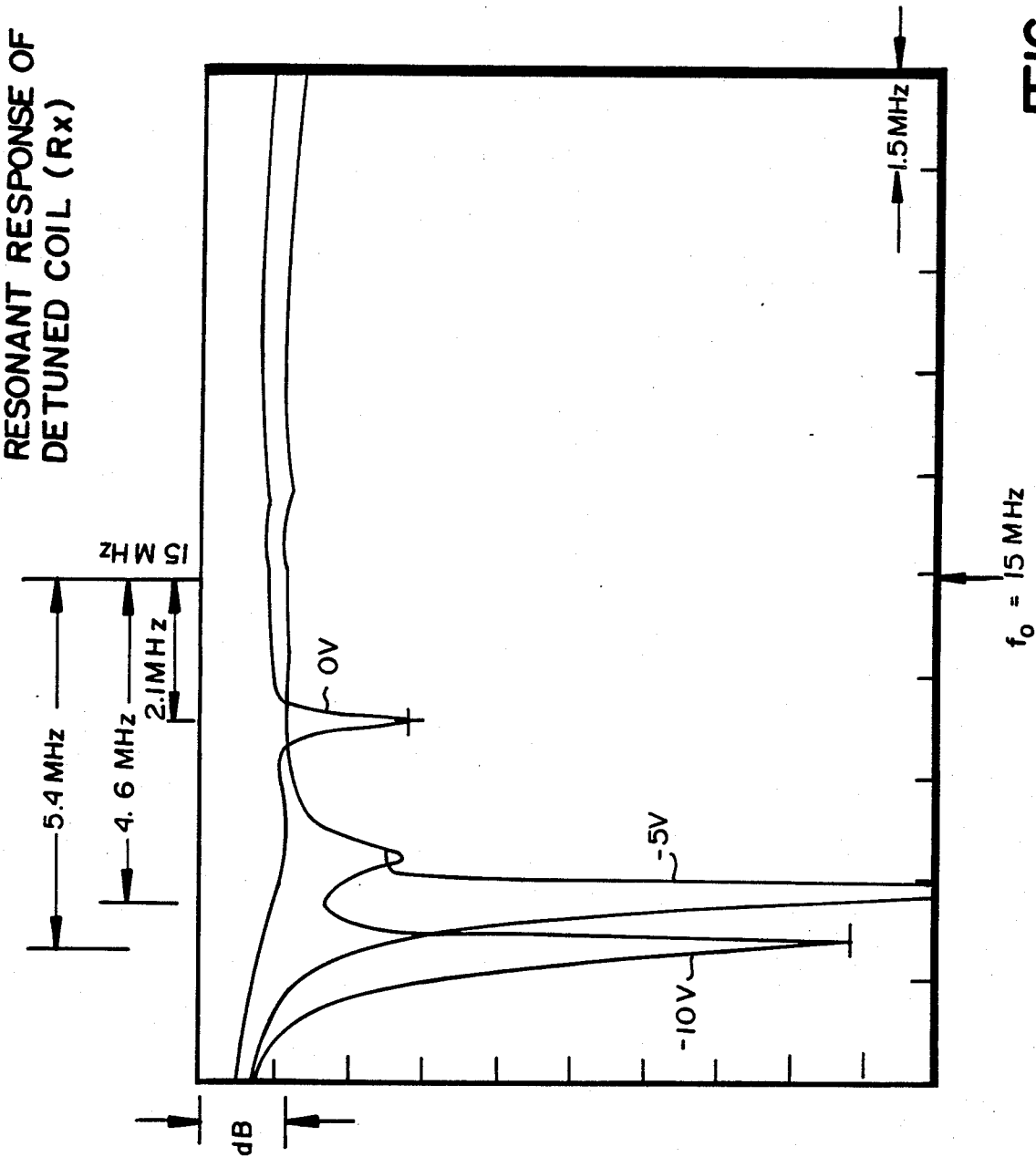
FIG. 5 is a graphical depiction of the resonant response of the detuned receive coil for selected different varactor diode forward bias voltages.

Such enhanced decoupling is accompanied by an enhanced detuning of the resonant frequency of the receive coil away from the resonant frequency of the transmit coil. For example, the resonant response of the detuned receive coil is depicted in FIG. 5 for three different varactor diode bias voltage magnitudes. As can be seen, for a zero varactor diode bias voltage, the resonant response of the receive coil is detuned from the nominal center frequency (e.g., 15 MHz) by approximately 2.1 MHz (e.g., not that much different from what is achievable with conventional practices). However, when the varactor diodes are forward biased by a magnitude of 5 volts, the resonant response of the receiver coil is shifted from the center frequency by approximately 4.6 MHz. At a varactor diode bias of $-10$ volts, the resonant response is shifted still further to approximately 5.4 MHz from the center frequency.

As should now be appreciated, the simple expedient of reversing the polarity (and suitably controlling the magnitude) of the varactor diode bias voltage supplied to the receive coil during transmit coil tuning procedures provides for materially enhanced detuning and decoupling of the receive coil from the transmit coil. And, by limiting the normal tuning bias voltage range (e.g., from 3 to 25 volts rather than from 0 to 25 volts), an enhanced detuning effect is also achieved.

The following table compares the prior art approach to detuning with that of this invention.

TABLE 1

|  | $V_{parallel}$ | $V_{series}$ |
|---|---|---|
| Tuning Receiving RF Coil (old) | 0 to +25 V | 0 to +25 V |
| Detuning (old) | 0 volts (fixed) | 0 volts (fixed) |
| Tuning Receiving RF Coil (New) | +3 to +25 V | +3 to +25 V |
| Detuning (New) | −24 V (fixed) | −24 V (fixed) |

It is quite apparent that if prior art tuning (not detuning) voltage for receiver coils happened to be near zero volts (as often happened), one would not get much, if any detuning effect.

While only one exemplary embodiment of this invention has been described in detail, those skilled in the art will recognize that many variations and modifications may be made in this exemplary embodiment while yet retaining many of the novel features and advantages of this invention. Accordingly, all such modifications and variations are intended to be included within the scope of the appended claims.

What is claimed is:

1. A method for decoupling an MRI RF receive coil from an MRI RF transmit coil during tuning of the transmit coil, said method comprising the step of:
   applying forward bias voltage to at least one varactor diode element connected in circuit with said receive coil.

2. A method as in claim 1 wherein said receive coil is connected in parallel tuned circuit with at least one pair of parallel-connected varactor diode and also connected with an RF coupling circuit including at least one further pair of parallel-connected varactor diode, said varactor diodes providing predetermined capacitance when reverse biased with a predetermined voltage, said applying step comprising the application of forward bias voltage to said plurality of varactor diode elements so as to greatly increase the capacitance and resistive losses thereof.

3. An MRI system comprising:
   an RF transmit coil including variable component parameters for changing its resonant frequency and transfer coupling impedance;
   control means for tuning component parameters of said RF transmit coil to a resonant and matched impedance state in which the transmit coil resonates and accepts transfer of maximum RF power at a predetermined RF frequency;
   an RF receive coil including at least one electrically tunable varactor diode element; and
   control means including means for detuning said RF receive coil to a low Q off-resonance state during said tuning of the RF transmit coil by applying a forward bias voltage across said varactor diode element.

4. An MRI system as in claim 3 wherein:
   said RF receive coil includes an inductance,
   a parallel tuning capacitance including a plurality of parallel-connected varactor diodes with a tuning bias voltage connection thereacross; and
   a pair of balanced series capacitances each including a plurality of parallel-connected varactor diodes with a tuning bias voltage connection thereacross; and
   said control means includes means for reversing the polarity of voltage applied to tuning bias voltage connections of the RF receive coil.

5. MRI appparatus comprising:
   a receive RF coil assembly having at least one varactor diode connected in circuit therewith and providing a capacitance which is a function of a reverse bias voltage connected thereacross; and
   means for reversing the polarity of said bias voltage so as to forward-bias the diode to detune the receive RF coil assembly.

* * * * *